United States Patent
Werner

(10) Patent No.: US 6,914,270 B2
(45) Date of Patent: Jul. 5, 2005

(54) IGBT WITH PN INSULATION AND PRODUCTION METHOD

(75) Inventor: Wolfgang Werner, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/931,689

(22) Filed: Aug. 16, 2001

(65) Prior Publication Data

US 2002/0066906 A1 Jun. 6, 2002

Related U.S. Application Data

(63) Continuation of application No. PCT/DE00/00281, filed on Feb. 1, 2000.

(30) Foreign Application Priority Data

Feb. 16, 1999 (DE) .......................... 199 06 384

(51) Int. Cl.[7] ........................ H01L 29/74; H01L 31/111
(52) U.S. Cl. .................................................... 257/119
(58) Field of Search ....................... 257/107, 119–131, 257/132, 146–153, 154–156, 168–172, 175–182, 500, 167, 147, 162, 165, 166

(56) References Cited

U.S. PATENT DOCUMENTS

| | | | | |
|---|---|---|---|---|
| 5,317,171 A | * | 5/1994 | Shekar et al. ............... | 257/138 |
| 5,321,281 A | * | 6/1994 | Yamaguchi et al. ........ | 257/212 |
| 5,585,650 A | * | 12/1996 | Kumagai .................... | 257/124 |
| 5,596,292 A | * | 1/1997 | Pezzani ...................... | 327/124 |
| 5,608,235 A | * | 3/1997 | Pezzani ...................... | 257/119 |
| 5,793,070 A | * | 8/1998 | Burke ......................... | 257/219 |
| 5,801,420 A | | 9/1998 | Fujishima | |
| 6,066,863 A | * | 5/2000 | Fujishima ................... | 257/133 |

FOREIGN PATENT DOCUMENTS

| | | |
|---|---|---|
| DE | 1 564 547 | 5/1970 |
| DE | 148 546 | 5/1981 |
| DE | 37 25 429 A1 | 2/1989 |
| DE | 198 05 786 A1 | 8/1999 |
| EP | 0 273 030 A2 | 6/1988 |
| EP | 0 338 312 A2 | 10/1989 |
| EP | 0 420 672 A1 | 4/1991 |
| EP | 0 767 499 A2 | 4/1997 |
| EP | 0 915 508 A1 | 5/1999 |
| JP | 63081861 | 4/1988 |
| JP | 03245562 | 11/1991 |
| JP | 05082775 A * | 4/1993 |

OTHER PUBLICATIONS

Simpson et al.: "Analysis of the Lateral Insulated Gate Transistor", IEDM 85, 1985 IEEE, pp. 740–743.

Disney et al.: "SOI LIGBT Devices with a Dual P–Well Implant for Improved Latching Characteristics" 5th International Symposium on Power Semiconductor Devices and ICs, 1993 IEEE, pp. 254–258.

Udrea et al.: "Lateral Insulated Gate Bipolar Transistor (LIGBT) Structure Based on Partial Isolation SOI Technology" Electronics Letters, May 8, 1997, vol. 33, No. 10, pp. 907–909.

* cited by examiner

Primary Examiner—B. William Baumeister
Assistant Examiner—Dana Farahani
(74) Attorney, Agent, or Firm—Laurence A. Greenberg; Werner H. Stemer; Ralph E. Locher

(57) ABSTRACT

The IGBT (insulated gate bipolar transistor) has a weakly doped drift zone of a first conductivity formed in a weakly doped semiconductor substrate of the same conductivity. A highly doped first well zone of the first conductivity and a highly doped second well zone of a second conductivity are arranged between the drift zone and the semiconductor substrate.

6 Claims, 2 Drawing Sheets

IGBT WITH PN INSULATION AND PRODUCTION METHOD

CROSS-REFERENCE TO RELATED APPLICATION

This application is a continuation of copending International Application No. PCT/DE00/00281, filed Feb. 1, 2000, which designated the United States.

BACKGROUND OF THE INVENTION

Field of the Invention

The present invention relates to an IGBT (insulated gate bipolar transistor) with PN insulation, having a low-doped drift zone of the one conductivity type, which is provided in a low-doped semiconductor substrate of the one conductivity type.

PN insulation and dielectric isolation are known for dielectrically isolating adjacent semiconductor components in a monolithically integrated circuit. In the case of PN insulation, adjacent components are electrically isolated from one another by means of a PN junction. Thus, for example U.S. Pat. No. 5,708,290 discloses how an N type channel MOS field effect transistor, which is embedded in an N type conductive well, is electrically isolated from a P type channel MOS field effect transistor by means of a $P^+$ type conductive region. Other examples of such PN insulation are known from U.S. Pat. No. 4,881,112 and European publication EP 0 282 734 A1.

PN insulation has significant advantages over dielectric isolation because it is significantly easier to implement: the necessary PN functions can be provided readily by diffusion or implantation together with the doping steps which are necessary in any case to manufacture the individual components, while dielectric isolation requires trenches to be provided and filled with silicon dioxide and/or silicon nitride, that is to say requires further measures in addition to the doping steps which are to be performed in any case and which can be utilized for PN insulation. In the case of IGBTs, which are used as "high-side" and "low-side" switches, it has, however, not been possible to date to use PN insulation (cf. "A Dielectric Isolated High-Voltage IC-Technology For Off-Line Applications" by Stoisiek, Oppermann, Schwalke, and Takacs in Proceedings of 1995 International Symposium on Power Semiconductor Devices and ICs, Yokohama, pages 325–33, and in particular page 325, left-hand column, second paragraph), so that at present only the costly dielectric isolation method is used. This is due ultimately to the fact that when customary PN insulation is used the high concentration of minority charge carriers, in particular defect electrons, which is necessary for the functioning of the IGBT would lead to unacceptably high substrate currents in the drift zone.

SUMMARY OF THE INVENTION

It is accordingly an object of the invention to provide a IGBT with PN insulation, which overcomes the above-mentioned disadvantages of the heretofore-known devices and methods of this general type and wherein, despite the use of PN insulation, it is possible to avoid the occurrence of unacceptably high substrate currents. It is a further object to provide for a corresponding method for manufacturing such an IGBT.

With the foregoing and other objects in view there is provided, in accordance with the invention, an IGBT with PN insulation, comprising:

a low-doped semiconductor substrate of a first conductivity type;

a low-doped drift zone of the first conductivity type formed in the low-doped semiconductor substrate;

a first highly doped well zone of the first conductivity type and a second highly doped well zone of a second conductivity type, opposite to the first conductivity type, successively disposed between the drift zone and the semiconductor substrate.

The above object is achieved according to the invention in an IGBT of the generic type in that a first highly doped well zone of the one conductivity type and a second highly doped well zone of the other conductivity type, opposite to the one conductivity type, are successively provided between the drift zone and the semiconductor substrate.

In accordance with an added feature of the invention, an IGBT cell with a cathode, and an anode surrounding the IGBT cell at a distance at an edge of the drift zone, are formed in the drift zone. As is known in these devices, an IGBT cell with a cathode and with an anode which surrounds the IGBT cell at a distance at the edge of the drift zone are provided in the drift zone here.

In accordance with an additional feature of the invention, a short circuit strap connects two well zones on a their surface.

In accordance with a further feature of the invention, a short-circuit strap is provided for connecting two well zones and the semiconductor substrate to one another on their surfaces.

That is, the two well zones are connected to one another on their surface by means of a short circuit strap. If necessary, the low-doped semiconductor substrate can also be connected to this short-circuit strap. This is the case, for example, if the one conductivity type is the N conductivity type, and the IGBT is used as a "high-side" switch.

With the above and other objects in view there is provided a method of manufacturing a well zone for the above-outlined IGBT which comprises: manufacturing horizontal regions of the well zones by one of implantation and diffusion, and manufacturing vertical regions of the well zones by performing at least two epitaxial steps with a subsequent process selected from the group consisting of implantation and diffusion Alternatively, the method comprises manufacturing horizontal regions of the well zones by one of implantation and diffusion, and manufacturing vertical regions of the well zones by etching trenches and subsequently filling the trenches with doped polycrystalline silicon and diffusing out.

Owing to its PN insulation, the IGBT according to the invention is relatively easy to manufacture: the horizontal regions of the two well zones can be provided by implantation and/or diffusion, while the vertical regions of these well zones can be generated, for example, by means of at least two epitaxial steps and subsequent implantation and/or diffusion.

A further possibility is to perform trench etching and subsequently fill the trenches generated in this way with $N^+$ type or $P^-$ type doped polycrystalline silicon and to allow the dopant to diffuse out into the adjacent monocrystalline silicon semiconductor regions.

In the IGBT according to the invention, a combination and corresponding wiring of PN junctions is proposed for the isolation of the component, permitting the substrate current to be basically avoided, but the minority charge carrier density in the drift zone is virtually unaffected by this. For this purpose, in the IGBT according to the invention the cathode or the IGBT cell is located in the center of, for example, an N⁻ type conductive drift zone if the one conductivity type is the N conductivity type. This N⁻ type conductive drift zone is successively surrounded by an N⁺ type conductive first well zone and a P⁺ type conductive second well zone.

The drift field occurring at the junction between the N⁺ type conductive first well zone and the N⁻ type conductive drift zone has the affect that only a small part of the defect electrons are capable of overcoming this barrier and penetrating into the P⁺ type conductive well zone. Trials have shown that this proportion is less than 1%.

However, in the P⁺ type conductive well zone the defect electrons are majority charge carriers. Because the PN junction between the two well zones is short-circuited by the short-circuit strap, the current flows away to the cathode. No minority charge carriers can thus pass into the N⁻-type conductive semiconductor substrate which is at the most positive potential of the potentials present in the circuit.

It is thus possible to integrate monolithically such an IGBT as a "high-side" switch and as a "low-side" switch, for example for bridge applications, without having to use costly dielectric isolation.

It is to be noted that in the above example the conductivity types can of course also be reversed. Likewise, it is also possible to install other components, for example CMOS transistors or bipolar transistors, in the respective wells which are formed by the two well zones.

Estimates show that wafers with the IGBT according to the invention permit a reduction in costs of up to about 50% in comparison with wafers wherein conventional IGBTs with dielectric isolation are provided.

Other features which are considered as characteristic for the invention are set forth in the appended claims.

Although the invention is illustrated and described herein as embodied in an IGBT with PN insulation, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
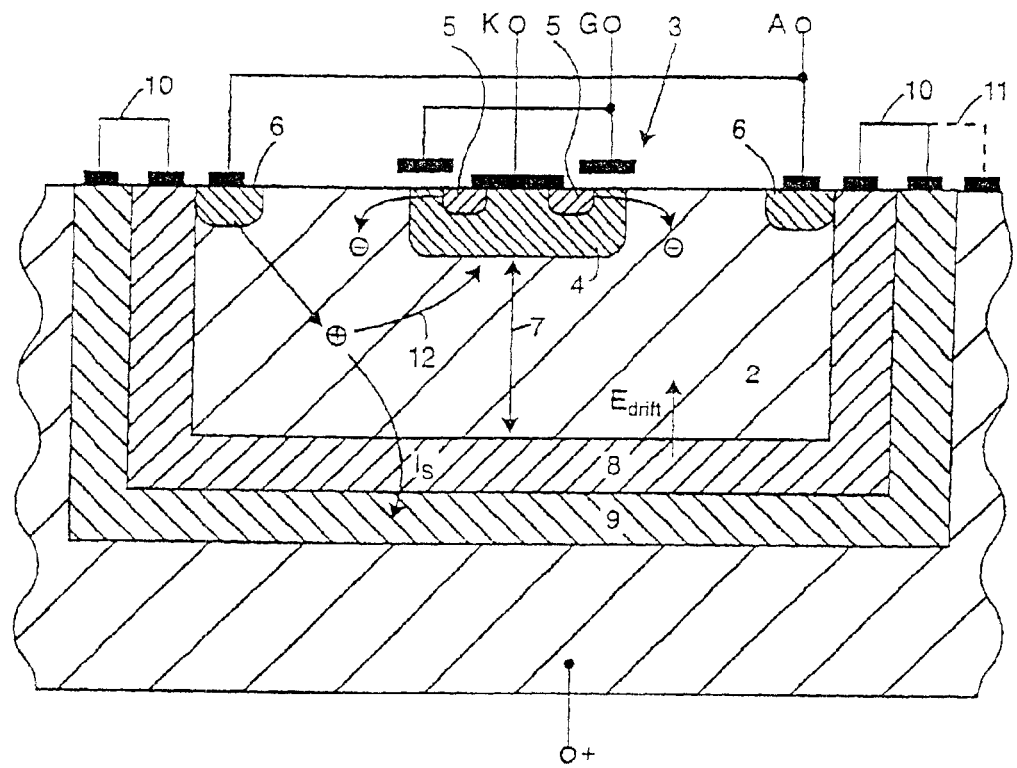
FIG. 1 is a sectional view taken through an exemplary embodiment of the IGBT according to the invention.

Referring now to the figures of the drawing in detail and first, particularly, to FIG. 1 thereof, there is shown an IGBT according to an exemplary embodiment of the present invention.

An N⁻ type conductive drift zone 2, wherein an IGBT cell 3 with an P type conductive zone 4 and N⁺ type conductive zones 5 are arranged is provided in an N⁻ type conductive semiconductor element 1. The latter is made of silicon, for example. Contact is made with the zones 4, 5 by means of a cathode electrode K, while gate electrodes G are arranged over the channel regions of the P type conductive zone 4, between the zones 5 and the drift zone 2. In addition, a P type conductive ring zone 6 with an anode electrode A is provided at the edge of the drift zone 2.

The drift zone 2 has an active layer with a thickness of $d_{epi}$ underneath the P type conductive zone 4, as indicated by a double arrow 7.

According to the invention, an N⁺ type conductive first well zone 8 and a P⁺ type conductive second well zone 9 are located between the drift zone 2 and the semiconductor substrate 1. The two well zones 8, 9 are connected to one another by means of a short-circuit strap 10. This short-circuit strap can also extend to the semiconductor substrate 1 in a "high-side" switch, as is indicated by a broken line 11.

The electrical field $E_{drift}$ that occurs at the junction between the N⁺-type conductive first well zone 8 and the N⁻-type conductive drift zone 2 has the effect that only a small part of the defect electrons which leave the P-type conductive zone are capable of overcoming this junction and of passing into the P⁺-type conductive second well zone 9, so that as a result of this measure alone a substrate current $I_S$ is already very small. The defect electrons in the P⁺-type conductive second well zone 9 are majority charge carriers. Because the PN junction between the two well zones 8, 9 is short-circuited by the short-circuit straps 10, the current flows away to the cathode (cf. the arrow 12), so that no minority charge carriers pass into the N⁻-type doped semiconductor substrate 1 which has the most positive potential value of the entire circuit arrangement.

It is thus easily possible, i.e. by means of PN insulation, to integrate monolithically the IGBT as a "high-side" switch and as a "low-side" switch without having to use the costly dielectric isolation.

A thickness $d_{epi}$ of the active layer of the drift zone 2 of approximately 35 μm is sufficient for a turn-off voltage of, say, 600 V. The well zones 8, 9 can be doped more highly, by one order of magnitude, for example, than the drift zone 2. However, still higher doping of the well zones 8, 9 with respect to the drift zone 2 is also possible. The drift zone 2 itself is doped in the customary way.

Figure 2:
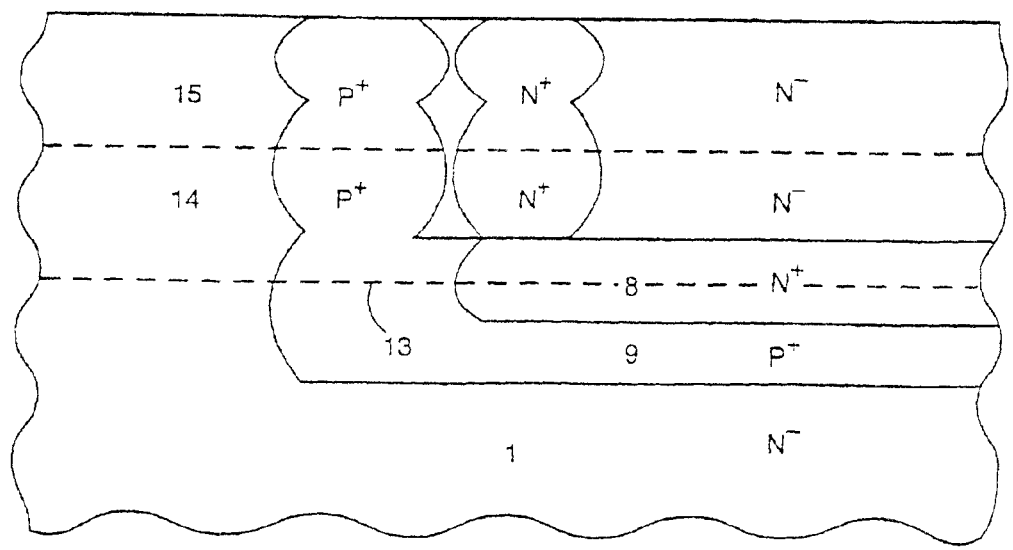
FIGS. 2 and 3 are respective sectional views explaining two different methods for manufacturing the well zones in the IGBT in FIG. 1.
Figure 3:
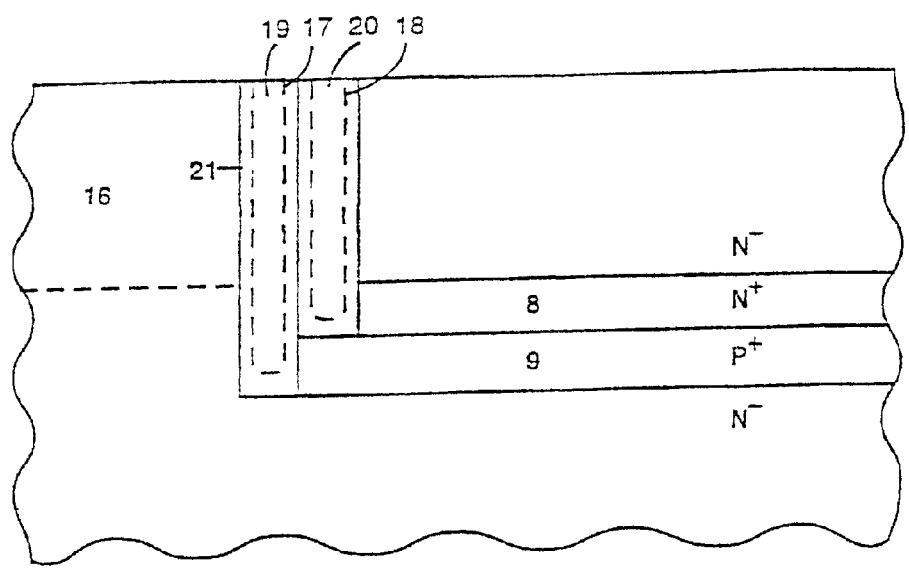

With reference to FIGS. 2 and 3, it is quite evident that the IGBT according to the invention can be easily manufactured. Here, the same reference symbols as in FIG. 1 are used in FIGS. 2 and 3 for corresponding parts.

In FIG. 2, the "bottom regions" of the well zones 8, 9 are provided in an N⁻-type conductive semiconductor substrate 1 which initially ends at a surface indicated by a broken line 13, by diffusion or implantation. Two epitaxial layers 14, 15 are then applied, the respective vertical region of the well zones 8, 9 being built up by implantation and/or diffusion after application of each individual epitaxial layer 14 or 15, respectively, and before the application of the next epitaxial layer.

FIG. 3 shows another method for manufacturing the well zones 8, 9 with the IGBT according to the invention. The bottom regions of these well zones 8, 9 are generated here initially in the same way as in the exemplary embodiment in FIG. 2. However, trenches 17, 18, which are filled with P⁺-type conductive polycrystalline silicon 19 or N⁺-type conductive polycrystalline silicon 20 are then provided in an epitaxial layer 16. Diffusing out of this polycrystalline silicon 19, 20 is then carried out so that the PN junctions 21 come to lie in the monocrystalline region.

I claim:

1. An IGBT with PN insulation, comprising:

a low-doped semiconductor substrate of a first conductivity type;

a low-doped drift zone of the first conductivity type formed in said low-doped semiconductor substrate; and a first highly doped well zone of the first conductivity type and a second highly doped well zone of a second conductivity type, opposite to the first conductivity type, successively disposed between said drift zone and said semiconductor substrate providing an electrical PN insulation;

an IGBT cell connected to an anode, a cathode, and gate electrodes;

said substrate, said well zones and said IGBT cell forming a semiconductor body; and said first well zone and said second well zone being electrically separated from said anode, said cathode, and said gate electrodes within said semiconductor body.

2. The IGBT according to claim 1, wherein said IGBT cell is formed in said drift zone and said anode surrounds said IGBT cell at a distance at an edge of said drift zone.

3. The IGBT according to claim 1, which comprises a short circuit strap connecting respective two well zones on a surface thereof.

4. The IGBT according to claim 1, which comprises a short-circuit strap connecting respective two well zones and said semiconductor substrate to one another on surfaces thereof.

5. A method of manufacturing a well zone for an IGBT, which comprises manufacturing horizontal regions of a well zone of an IGBT according to claim 1 by one of implantation and diffusion, and manufacturing vertical regions of the well zones by performing at least two epitaxial steps with a subsequent process selected from the group consisting of implantation and diffusion.

6. A method of manufacturing a well zone for the IGBT according to claim 1, which comprises manufacturing horizontal regions of a well zone of an IGBT according to claim 1 by one of implantation and diffusion, and manufacturing vertical regions of the well zones by etching trenches and subsequently filling the trenches with doped polycrystalline silicon and diffusing out.

* * * * *